United States Patent
Tanimoto et al.

(10) Patent No.: US 11,953,536 B2
(45) Date of Patent: Apr. 9, 2024

(54) ELECTROMAGNETIC WAVE VISUALIZATION DEVICE

(71) Applicant: Panasonic Intellectual Property Management Co., Ltd., Osaka (JP)

(72) Inventors: Shinichi Tanimoto, Kyoto (JP); Ryo Matsubara, Osaka (JP); Shinkuro Fujino, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 40 days.

(21) Appl. No.: 17/632,162

(22) PCT Filed: Jul. 14, 2020

(86) PCT No.: PCT/JP2020/027378
§ 371 (c)(1),
(2) Date: Feb. 1, 2022

(87) PCT Pub. No.: WO2021/024713
PCT Pub. Date: Feb. 11, 2021

(65) Prior Publication Data
US 2022/0283211 A1  Sep. 8, 2022

(30) Foreign Application Priority Data
Aug. 2, 2019  (JP) .................................. 2019-143221

(51) Int. Cl.
*G01R 29/08*  (2006.01)

(52) U.S. Cl.
CPC ..... *G01R 29/0892* (2013.01); *G01R 29/0878* (2013.01)

(58) Field of Classification Search
CPC ............ G01R 29/0878; G01R 29/0892; G01R 29/0871
See application file for complete search history.

(56) References Cited

U.S. PATENT DOCUMENTS

2003/0231145 A1* 12/2003 Uesaka ................ G01R 31/001 345/35
2004/0021773 A1  2/2004 Hayakawa
(Continued)

FOREIGN PATENT DOCUMENTS

JP  2000-088903 A  3/2000
JP  2010-019795 A  1/2010
(Continued)

OTHER PUBLICATIONS

U.S. Appl. No. 17/631,760 to Shinichi Tanimoto et al., filed Jan. 31, 2022.
(Continued)

*Primary Examiner* — Jermele M Hollington
*Assistant Examiner* — Suresh K Rajaputra
(74) *Attorney, Agent, or Firm* — Greenblum & Bernstein, P.L.C.

(57) ABSTRACT

An electromagnetic wave visualization device includes an image acquisition unit that captures an image of a target device, a measurement unit that measures an electromagnetic wave intensity of the target device, a controller that sets a measurement range of the measurement unit and generates a composite image in which a measurement result of the measured electromagnetic wave intensity is superimposed on the captured image of the target device acquired by the image acquisition unit, and an output unit that outputs the composite image generated by the controller, in which the controller generates the composite image including the measurement range of the measurement unit and outputs the composite image to the output unit.

7 Claims, 14 Drawing Sheets

(56) References Cited

U.S. PATENT DOCUMENTS

| | | | | |
|---|---|---|---|---|
| 2006/0132118 A1* | 6/2006 | Maekawa | ........... | G01R 29/0871 |
| | | | | 324/96 |
| 2014/0347230 A1 | 11/2014 | Ohmae et al. | | |
| 2015/0219704 A1* | 8/2015 | Ohmae | .............. | G01R 29/0871 |
| | | | | 702/67 |
| 2015/0293162 A1* | 10/2015 | Tsukamoto | ........ | G01R 29/0892 |
| | | | | 702/75 |
| 2016/0138919 A1* | 5/2016 | Green | ................... | H04N 23/633 |
| | | | | 348/135 |
| 2018/0335300 A1* | 11/2018 | Masuda | .................. | G03B 37/02 |
| 2018/0347981 A1* | 12/2018 | Masuda | ............... | G01C 15/004 |
| 2021/0318173 A1* | 10/2021 | Nagaoka | .................. | G06F 18/22 |

FOREIGN PATENT DOCUMENTS

| | | |
|---|---|---|
| JP | 2013-130466 A | 7/2013 |
| JP | 2014-129075 A | 7/2014 |
| JP | 2014-231994 A | 12/2014 |
| JP | 2015-194367 A | 11/2015 |
| WO | 2002/023142 A1 | 3/2002 |
| WO | 2014/002466 A1 | 1/2014 |

OTHER PUBLICATIONS

International Search Report issued in International Bureau of WIPO Patent Application No. PCT/JP2020/027378, dated Sep. 29, 2020, along with an English translation thereof.

\* cited by examiner

ELECTROMAGNETIC WAVE VISUALIZATION DEVICE

TECHNICAL FIELD

The present disclosure relates to an electromagnetic wave visualization device.

BACKGROUND ART

PTL 1 discloses electromagnetic wave visualization device including an emission direction separator that changes an emission direction of an electromagnetic wave according to an incidence direction of the electromagnetic wave, a plurality of sensors each of which detects energy of the electromagnetic wave emitted from the emission direction separator and outputs a detection signal with a strength corresponding to a magnitude of the detected energy, a processor that is able to receive the detection signal from each of the plurality of sensors, and outputs a display signal including information regarding an arrival direction of the electromagnetic wave correlated with the sensor that has transmitted the detection signal when the detection signal is received from the sensor, and a display that can display each of arrival directions of a plurality of electromagnetic waves, and displays the arrival directions of the electromagnetic waves when the display signal is received.

CITATION LIST

Patent Literature

PTL 1: Japanese Patent Unexamined Publication No. 2013-130466

SUMMARY OF THE INVENTION

The present disclosure has been devised in view of the above circumstances of the related art, and an object thereof is to provide an electromagnetic wave visualization device that efficiently displays a measurement result of a region required by a user among measurement results regarding an electromagnetic wave intensity of a target device, and thus improves the user's convenience.

According to the present disclosure, there is provided an electromagnetic wave visualization device including an image acquisition unit that captures an image of a target device; a measurement unit that measures an electromagnetic wave intensity of the target device; a controller that sets a measurement range of the measurement unit and generates a composite image in which a measurement result of the measured electromagnetic wave intensity is superimposed on the captured image of the target device acquired by the image acquisition unit; and an output unit that outputs the composite image generated by the controller, in which the controller generates the composite image including the measurement range of the measurement unit and outputs the composite image to the output unit.

According to the present disclosure, it is possible to efficiently display a measurement result of a region required by a user among measurement results regarding an electromagnetic wave intensity of a target device and thus to improve the user's convenience.

DESCRIPTION OF EMBODIMENT

Background of Details of Exemplary Embodiment

PTL 1 discloses an electromagnetic wave visualization device capable of visualizing an electromagnetic wave generation source in real time. This electromagnetic wave visualization device is configured to include an emission direction separator that emits an electromagnetic wave in an emission direction according to an incidence direction of the electromagnetic wave, a plurality of sensors each of which outputs a detection signal with a strength corresponding to a magnitude of energy of the electromagnetic wave emitted from the emission direction separator, a processor that outputs a display signal including information regarding an arrival direction of the electromagnetic wave correlated with the sensor that has transmitted the detection signal, and a display that can display each of arrival directions of a plurality of electromagnetic waves, and displays the arrival directions of the electromagnetic waves when the display signal is received. This electromagnetic wave visualization device can visualize an electromagnetic wave generation source in real time by displaying an arrival direction of the incident electromagnetic wave and outputting a detection result of the electromagnetic wave intensity.

However, in the electromagnetic wave visualization device of the related art, since the display includes a range other than the measurement range, it is not possible to display only a range of a measurement result required by a user. Therefore, in the following Exemplary Embodiment 1, a description will be made of an example of an electromagnetic wave visualization device that efficiently displays a measurement result of a region required by a user among measurement results regarding an electromagnetic wave intensity of a target device and thus improves the user's convenience.

Hereinafter, Exemplary Embodiment 1 in which a configuration and an operation of the electromagnetic wave visualization device according to the present disclosure are specifically disclosed will be described in detail with reference to the drawings as appropriate. However, more detailed description than necessary may be omitted. For example, detailed description of already well-known matters and repeated description of substantially the same configuration may be omitted. This is to avoid unnecessary redundancy of the following description and to facilitate the understanding of those skilled in the art. The accompanying drawings and the following description are provided for those skilled in the art to fully understand the present disclosure, and are not intended to limit the subject matter described in the claims.

Exemplary Embodiment 1

Figure 1:
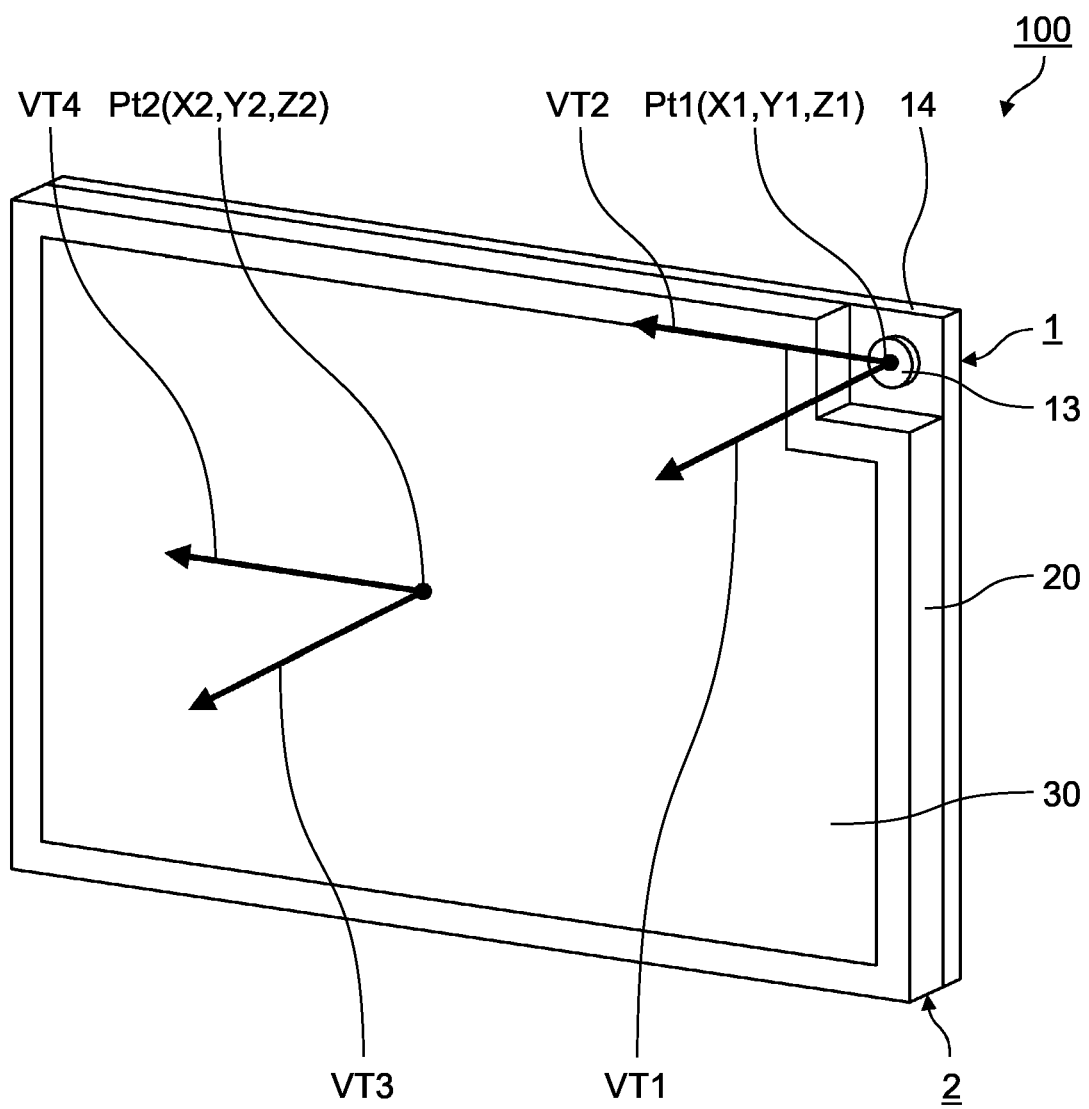
FIG. 1 is an appearance diagram illustrating an example of an electromagnetic wave visualization device according to Exemplary Embodiment 1.
Figure 2:
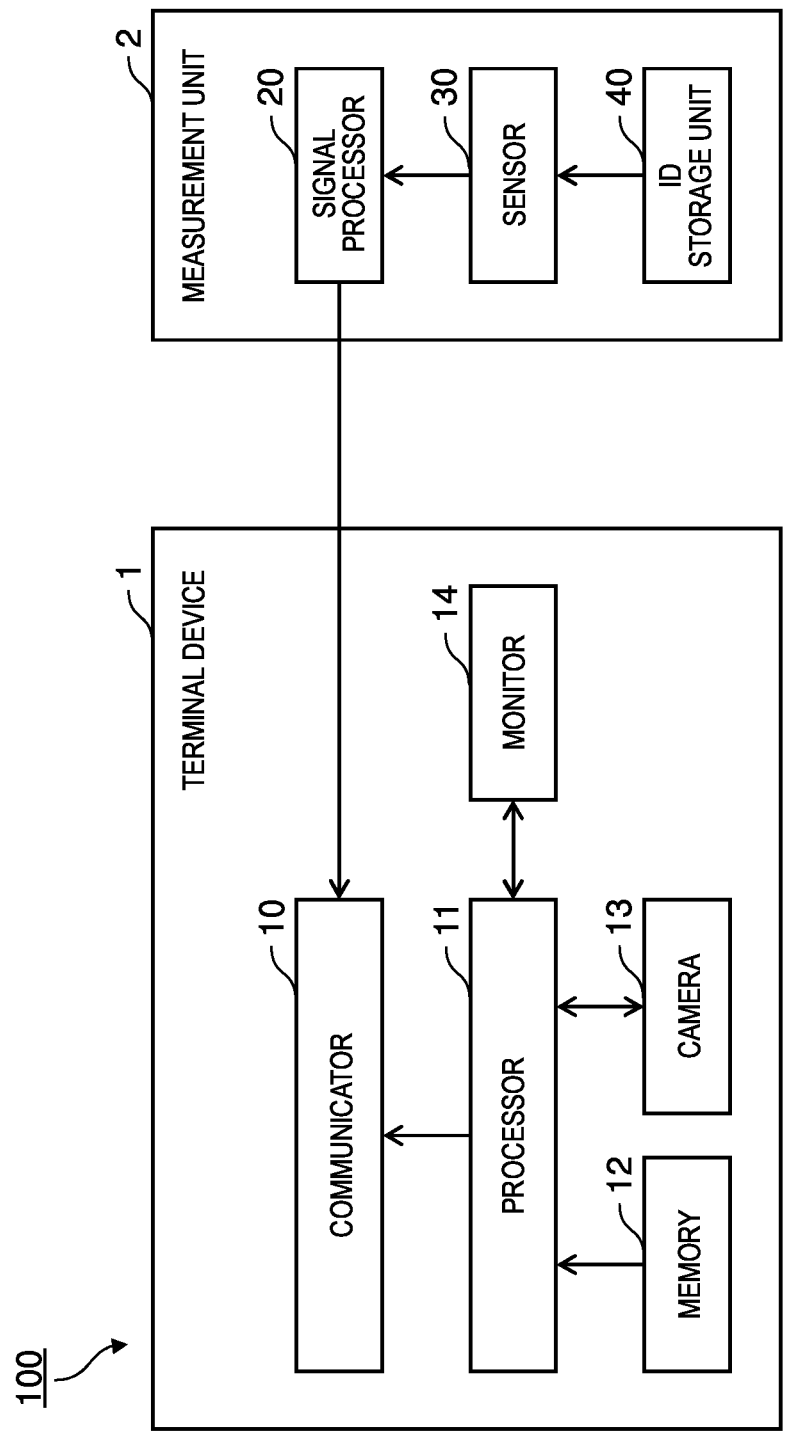
FIG. 2 is a diagram illustrating an internal configuration example of the electromagnetic wave visualization device according to Exemplary Embodiment 1.

First, electromagnetic wave visualization device 100 according to Exemplary Embodiment 1 will be described with reference to FIGS. 1 and 2. FIG. 1 is an appearance diagram illustrating an example of electromagnetic wave visualization device 100 according to Exemplary Embodiment 1. FIG. 2 is a diagram illustrating an internal configuration example of electromagnetic wave visualization device 100 according to Exemplary Embodiment 1. Electromagnetic wave visualization device 100 according to Exemplary Embodiment 1 is, for example, a portable device that is grasped by a user and measures an electromagnetic wave intensity of target device Tg1 that is an electromagnetic wave measurement target. Electromagnetic wave visualization device 100 includes terminal device 1 and measurement unit 2.

Terminal device 1 is a portable device such as a so-called tablet PC or smartphone. Terminal device 1 generates a heat map image based on the electromagnetic wave intensity of target device Tg1 received by measurement unit 2 that will be described later, further generates a composite image in which the heat map image is superimposed on a captured image of target device Tg1 acquired by camera 13, and displays the composite image on monitor 14. Terminal device 1 is configured to include communicator 10, processor 11, memory 12, camera 13, and monitor 14. Camera 13 and monitor 14 are not essential constituents and may be omitted.

Here, target device Tg1 is an electrical/electronic device that is a measurement target of an electromagnetic wave intensity (in other words, an intensity of a noise signal generated from target device Tg1). Target device Tg1 may be a device configured to include one or more conductors as generation sources of electromagnetic waves, and may be a conductor itself as a generation source of an electromagnetic wave. Target device Tg1 that is selected by the user and of which the electromagnetic wave intensity is measured may be one or a plurality.

Communicator 10 is communicatively connected by wire to signal processor 20 of measurement unit 2. Specifically, each of communicator 10 of terminal device 1 and signal processor 20 in measurement unit 2 has a Universal Serial Bus (USB) connector (not illustrated) and is connected by wire by using a USB cable (not illustrated). Communicator 10 outputs a measurement result of the electromagnetic wave intensity of target device Tg1 received from signal processor 20 to processor 11.

Communicator 10 may be wirelessly communicatively connected to signal processor 20. The wireless communication referred to here is communication via, for example, short-range wireless communication such as Bluetooth (registered trademark) or NFC (registered trademark), or a wireless local area network (LAN) such as Wifi (registered trademark).

Processor 11 as an example of a controller is configured by using, for example, a central processing unit (CPU), a digital signal processor (DSP), or a field programmable gate array (FPGA), and controls an operation of each unit of terminal device 1. Processor 11 functions as a controller of terminal device 1, and performs a control process for overall control of an operation of each unit of terminal device 1, a data input/output process with each unit of terminal device 1, a data calculation (computation) process, and a data storage process. Processor 11 operates according to a program and data stored in memory 12. Processor 11 starts measuring the electromagnetic wave intensity of target device Tg1 with setting of a measurement range of the electromagnetic wave intensity of target device Tg1 that will be described later as a trigger or with input of a trigger signal from camera 13 as a trigger.

When it is detected that measurement unit 2 is attached to terminal device 1, processor 11 detects a signal transmitted from measurement unit 2. Here, since a method of detecting that measurement unit 2 is attached to terminal device 1 is a well-known technique, the details thereof will be omitted, but for example, contact may be detected mechanically or may be detected by using an electric circuit. Processor 11 detects (identifies) Identification (ID) information for each measurement unit 2 that is set in advance and stored in memory 12 on the basis of the detected signal. For example, processor 11 may collate an ID of each measurement unit 2 included in a signal transmitted from measurement unit 2 with an ID list (not illustrated) of each measurement unit 2 stored in memory 12, and detect (identify) the ID of measurement unit 2 in a case where the IDs match each other. Processor 11 reads various types of information stored in association with the detected (identified) ID information from memory 12. The various types of information referred to here are frequency bandwidth information that can be measured by an antenna (not illustrated) of measurement unit 2, wave impedance characteristics (not illustrated) of the antenna, a correction coefficient table (not illustrated) for correcting a reception signal of the antenna on the basis of the wave impedance characteristics, and information regarding sensor 30 capable of receiving electromagnetic waves. The ID information of the measurement unit 2 may be automatically detected (identified) by processor 11, or ID information of a measurement unit 2 attached by the user may be input.

On the basis of the detected ID information of measurement unit 2, processor 11 reads and acquires information regarding sensor 30 included in measurement unit 2 (for example, a reception area where electromagnetic waves can be received, a central position, and a shape) from memory 12. Processor 11 calculates coordinates (X2, Y2, Z2) of reference point Pt2 of attached sensor 30 on the basis of the acquired information regarding sensor 30. Processor 11 sets vertical vector VT3 that passes through reference point Pt2 on sensor 30 and is in a vertical direction to a plane (electromagnetic wave receiving surface) of sensor 30. Processor 11 sets horizontal vector VT4 that passes through reference point Pt2 and is parallel to the plane (electromagnetic wave receiving surface) of sensor 30 and perpendicular to vertical vector VT3.

Similarly, processor 11 reads and acquires information regarding camera 13 (for example, an angle of view and an installation angle of camera 13) from memory 12. Processor 11 calculates coordinates (X1, Y1, Z1) of reference point Pt1 with the center of a lens (not illustrated) of camera 13 as a reference on the basis of the acquired information regarding camera 13. Processor 11 sets central axis vector VT1 that passes through reference point Pt1 that is the center of the lens of camera 13 and is in the same direction as the central axis of the lens, on the basis of the installation angle of camera 13. Processor 11 sets perpendicular vector VT2 that passes through reference point Pt1 and indicates a direction perpendicular to central axis vector VT1 in the same direction as the central axis of the lens.

Processor 11 calculates a distance between reference point Pt1 and reference point Pt2, an angle formed between central axis vector VT1 and vertical vector VT3, and an angle formed between perpendicular vector VT2 and horizontal vector VT4. Specifically, processor 11 calculates an angle formed between central axis vector VT1 indicating the central axis of the lens of camera 13 and vertical vector VT3 indicating the vertical direction to the electromagnetic wave reception plane of sensor 30, and an angle formed between perpendicular vector VT2 indicating the direction perpendicular to central axis vector VT1 of camera 13 and horizontal vector VT4 indicating the horizontal direction to the electromagnetic wave reception plane of sensor 30. On the basis of these calculation results, processor 11 calculates an offset amount for subjecting a signal received at a predetermined position (coordinates) on sensor 30 to position conversion to a corresponding predetermined position (coordinates) within the angle of view of camera 13. Processor 11 stores information regarding the calculated offset amount in memory 12.

Processor 11 starts measuring the electromagnetic wave intensity generated from target device Tg1 in operation by being triggered by the start of imaging by camera 13 or by the user's selection of at least one target device Tg1 among one or more target devices captured in an imaging region. Processor 11 generates a heat map image on the basis of a measurement result of the electromagnetic wave intensity. The heat map image is generated according to a range in which sensor 30 can measure the electromagnetic wave intensity (hereinafter, referred to as a measurement range).

Processor 11 executes position (coordinate) alignment between the captured image and the heat map image on the basis of the calculated offset amount (for example, position alignment between reference point Pt1 and reference point Pt2), and generates a composite image in which the heat map image is superimposed on the captured image. Processor 11 cuts out the measurement range from the generated composite image and outputs the measurement range to monitor 14. In this case, processor 11 maintains an aspect ratio of the cutout composite image, generates a composite image enlarged or reduced such that the composite image is displayed in the largest size on monitor 14, and outputs the composite image to monitor 14.

A cutout range of the composite image (that is, a range of the generated composite image to be output to monitor 14) is not limited to the above example. In the following description, a cutout range of the generated composite image to be displayed on monitor 14 will be referred to as a display range.

For example, processor 11 may receive an image processing result of capturing a contour of target device Tg1 from camera 13, and set, as a measurement range, a range in which the range of the calculated offset amount is expanded in all directions outside the contour of target device Tg1 of which the electromagnetic wave intensity is measured on the basis of the image processing result. In such a case, processor 11 may set a measurement range including the offset amount as a display range.

The display range may be set on the basis of a user's input operation. Hereinafter, a range set on the basis of the user's input operation will be referred to as a designated range. In such a case, processor 11 sets a range including the designated range and the measurement range as the display range. In a case where, after the designated range is set, a positional relationship between electromagnetic wave visualization device 100 and target device Tg1 is changed (for example, in a case where either electromagnetic wave visualization device 100 or target device Tg1 is moved) and thus the set designated range is moved out of the current angle of view, processor 11 may set the angle of view as the display range.

Processor 11 may set the display range to the angle of view in a case where target device Tg1 is located outside the angle of view on the basis of the captured image and the image processing result received from camera 13.

Consequently, electromagnetic wave visualization device 100 according to Exemplary Embodiment 1 can efficiently display a measurement result of a region required by a user among measurement results regarding the electromagnetic wave intensity of the target device and thus improve the user's convenience.

Memory 12 includes, for example, a random access memory (RAM) as a work memory used when each process of processor 11 is executed and a read only memory (ROM) that stores programs and data defining an operation of processor 11. Data or information generated or acquired by processor 11 is temporarily stored in the RAM. A program defining an operation of processor 11 is written in the ROM. Memory 12 stores identification (ID) information preset for each of the plurality of measurement units 2 that can be attached to and detached from terminal device 1, information regarding camera 13, coordinate information of each of reference points Pt1 and Pt2, information regarding each of central axis vector VT1, perpendicular vector VT2, vertical vector VT3, and horizontal vector VT4, information regarding the offset amount, information regarding the designated range, and the like.

Camera 13 as an example of an image acquisition unit and a distance measuring unit includes at least a lens (not illustrated) and an image sensor (not illustrated). The image sensor is, for example, a solid-state imaging sensor such as a charged-coupled device (CCD) or a complementary metal oxide semiconductor (CMOS), and converts an optical image formed on an imaging surface into an electric signal. When the user selects at least one target device Tg1 from among one or more target devices captured in the imaging region, camera 13 sets a measurement range including target device Tg1 captured in the captured image. Camera 13 generates a trigger signal for starting measurement of the electromagnetic wave intensity generated during an operation of target device Tg1 and outputs the trigger signal to processor 11.

Camera 13 is provided in terminal device 1, captures an image of target device Tg1, and outputs the acquired captured image to processor 11.

Needless to say, an installation location of camera 13 is not limited to the example illustrated in FIG. 1. For example, camera 13 may be located on a surface opposite to a surface on which monitor 14 is provided and at the center of terminal device 1. A plurality of cameras 13 may be provided, and a measurement distance and direction to target device Tg1 may be measured by using each of a plurality of captured images.

Monitor 14 as an example of an output unit is configured by using, for example, a liquid crystal display (LCD) or an organic electroluminescence (EL), and displays a captured image acquired by camera 13 or a composite image in which a heat map image (that is, a measurement result of the electromagnetic wave intensity) is superimposed on the captured image.

Monitor 14 may be implemented by, for example, a head mounted display (HMD) communicatively connected to terminal device 1 in a wired or wireless manner. Monitor 14 displays a composite image (that is, a measurement result) that is output to the outside from processor 11 of terminal device 1.

Monitor 14 may be a touch interface provided in terminal device 1 and configured with a touch panel. Monitor 14 accepts the user's input operation and outputs a result of the user's input operation to processor 11.

Measurement unit 2 receives an electromagnetic wave generated from the target device in operation and measures the electromagnetic wave intensity. Measurement unit 2 is configured to be able to receive electromagnetic waves in different frequency bandwidths, and is detachably attached to a surface provided with camera 13. Measurement unit 2 illustrated in FIG. 2 indicates a state in which one of a plurality of antenna devices corresponding to the electromagnetic wave intensity in a predetermined frequency bandwidth is attached, and a structure for attaching and detaching the antenna device is not illustrated.

Measurement unit 2 is attached to terminal device 1 by the user according to a frequency bandwidth generated from the target device that is a measurement target. The frequency bandwidth that can be measured by using the plurality of antenna devices according to Exemplary Embodiment 1 is a frequency bandwidth of 9 kHz to 6 GHz according to the electromagnetic compatibility (EMC) standard. The frequency bandwidth is not limited to this, and may be 6 GHz or higher.

Measurement unit 2 illustrated in FIG. 1 has substantially the same size (area) as that of terminal device 1 except for the periphery of camera 13, but needless to say, a size and a shape of measurement unit 2 are not limited to the example illustrated in FIG. 1. The size of measurement unit 2 may be larger or smaller than that of monitor 14, for example. A shape of measurement unit 2 may be, for example, a rectangular shape. Measurement unit 2 includes signal processor 20, sensor 30, and ID storage unit 40.

Signal processor 20 performs conversion into a signal indicating the electromagnetic wave intensity generated from the target device on the basis of a reception signal intensity that has been received by sensor 30. Signal processor 20 has a USB connector, associates the converted signal with coordinate information on sensor 30, and transmits the measurement result of the electromagnetic wave intensity of target device Tg1 to communicator 10 of terminal device 1 via a USB cable connected therebetween. Signal processor 20 may transmit the measurement result to terminal device 1 by using short-range wireless communication or wireless LAN communication such as Wifi (registered trademark). The short-range wireless communication referred to here is, for example, Bluetooth (registered trademark) or NFC (registered trademark).

Sensor 30 has, for example, a dipole antenna or one or a plurality of loop antennas, and is configured to receive electromagnetic waves in a predetermined frequency bandwidth. Sensor 30 may be formed as a planar antenna. Sensor 30 outputs a reception signal that has received the electromagnetic wave generated from target device Tg1 to signal processor 20.

ID storage unit 40 is configured with, for example, a ROM, and stores the ID information of the measurement unit 2. ID storage unit 40 is not limited to storing the ID information, and may store information for identifying attached measurement unit 2, such as a serial number.

Figure 3:
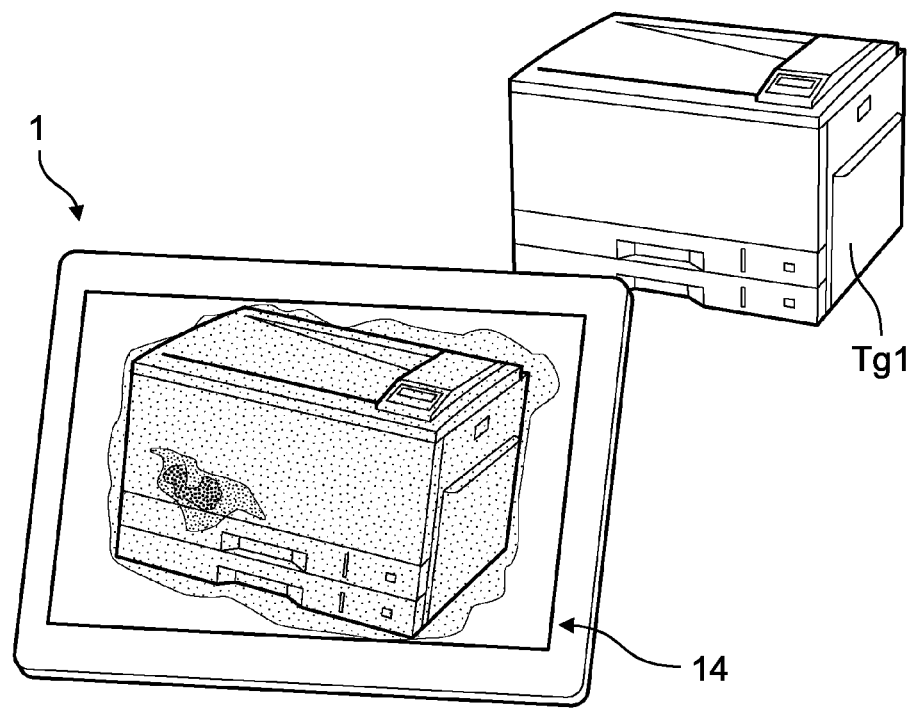
FIG. 3 is a diagram illustrating an example of a use case of the electromagnetic wave visualization device according to Exemplary Embodiment 1.

FIG. 3 is a diagram illustrating an example of a use case of electromagnetic wave visualization device 100 according to Exemplary Embodiment 1. Electromagnetic wave visualization device 100 is grasped by the user or placed on a desk or the like to measure the electromagnetic wave intensity generated from target device Tg1.

Electromagnetic wave visualization device 100 images target device Tg1 with camera 13 provided on the surface opposite to monitor 14, and also measures electromagnetic wave intensity generated from target device Tg1 in operation with measurement unit 2 attached to the surface opposite to monitor 14. Processor 11 generates a heat map image on the basis of the measurement result of the electromagnetic wave intensity, generates a composite image in which the heat map image is superimposed on the captured image, and displays the composite image on monitor 14. Although the measurement result of the electromagnetic wave intensity of target device Tg1 is displayed as the heat map image in FIG. 3, a method of displaying the measurement result is not limited to this, and may be, for example, a numerical value.

Consequently, electromagnetic wave visualization device 100 according to Exemplary Embodiment 1 can efficiently display an intensity of an electromagnetic wave generated during an operation of target device Tg1 in the operation environment thereof and thus improve a user's convenience, without taking out a predetermined conductor that is a generation source of the electromagnetic wave.

Figure 4A:
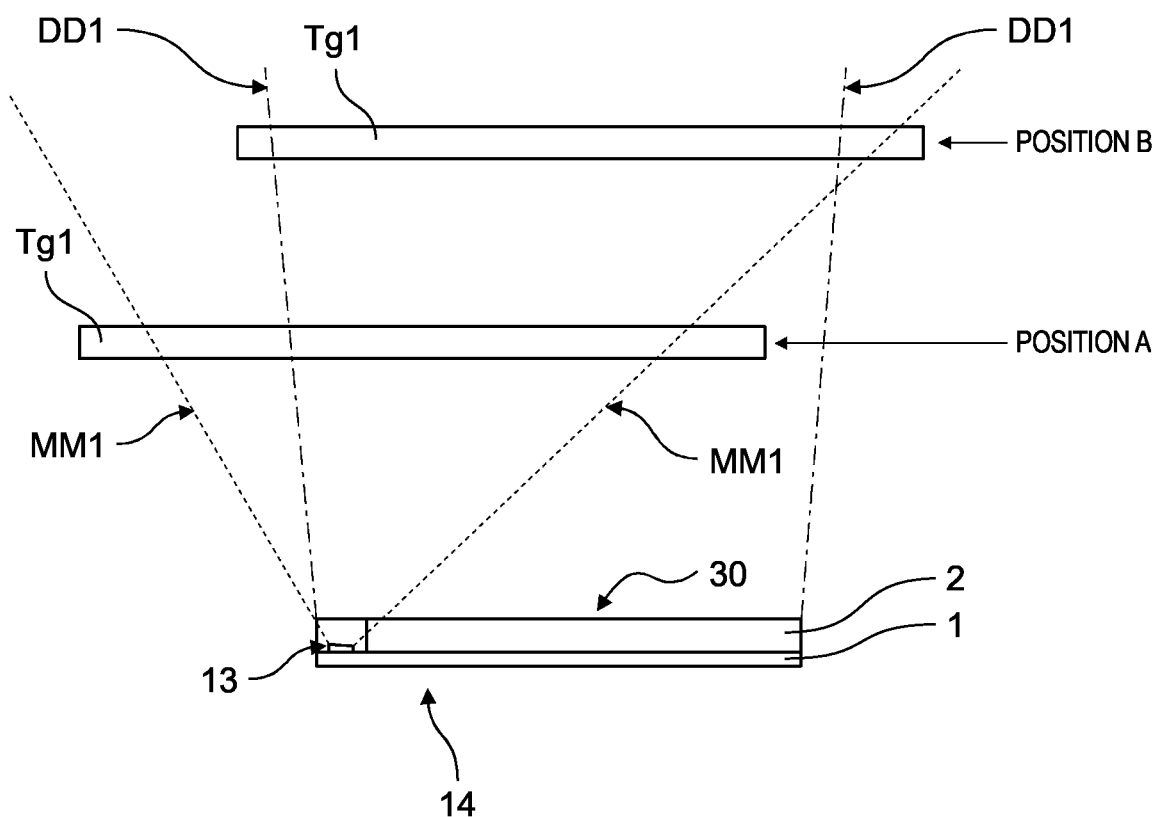
FIG. 4A is a top view illustrating a use case example of the electromagnetic wave visualization device according to Exemplary Embodiment 1.
Figure 4B:
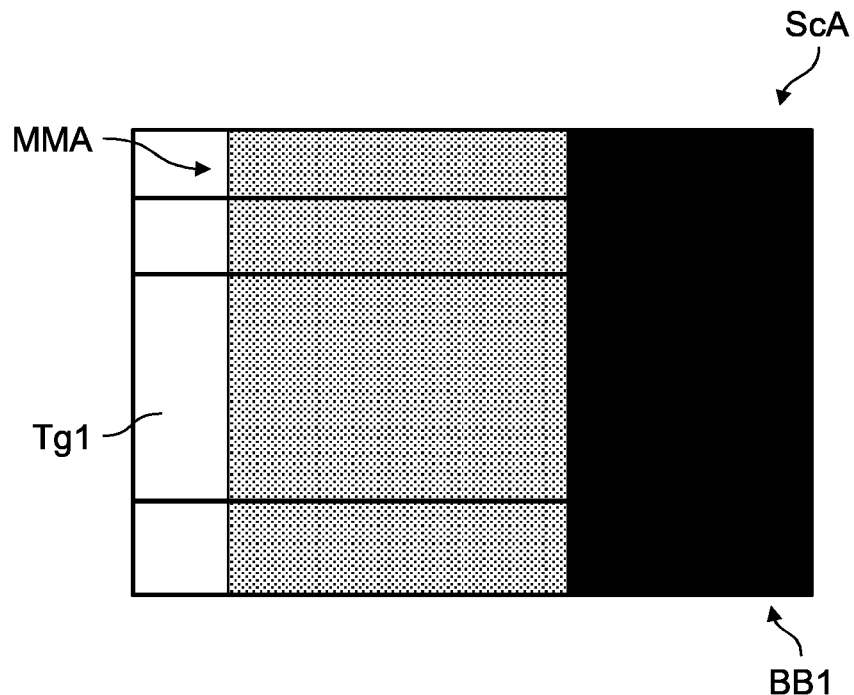
FIG. 4B illustrates a display example in a use case (position A) of the electromagnetic wave visualization device according to Exemplary Embodiment 1.
Figure 4C:
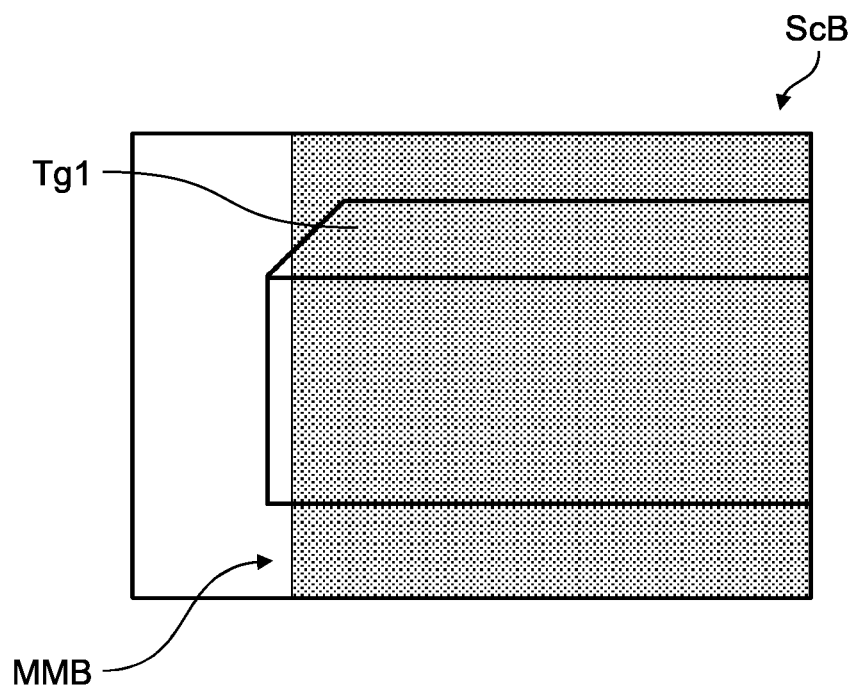
FIG. 4C illustrates a display example in a use case (position B) of the electromagnetic wave visualization device according to Exemplary Embodiment 1.

A use case example and a display example of electromagnetic wave visualization device 100 will be described with reference to FIGS. 4A to 4C. FIG. 4A is a top view illustrating a use case example of electromagnetic wave visualization device 100 according to Exemplary Embodiment 1. FIG. 4B is a display example in a use case (position A) of electromagnetic wave visualization device 100 according to Exemplary Embodiment 1. FIG. 4C illustrates a display example in a use case (position B) of electromagnetic wave visualization device 100 according to Exemplary Embodiment 1.

FIG. 4A illustrates a case where the electromagnetic wave intensity of target device Tg1 is measured by using electromagnetic wave visualization device 100. Camera 13 has angle of view MM1 and images target device Tg1. Sensor 30 has measurement range DD1 and measures the electromagnetic wave intensity generated from target device Tg1 in operation. Electromagnetic wave visualization device 100 illustrated in FIG. 4A measures the electromagnetic wave intensity generated from target device Tg1 in operation at each of positions A and B. Electromagnetic wave visualization device 100 illustrated in FIG. 4A is configured with terminal device 1 and measurement unit 2, but is an example, and a use case is not limited to this.

In a case where target device Tg1 is located at position A, as illustrated in FIG. 4B, a measurement result (screen ScA) of which a display range is a range including angle of view MM1 and measurement range DD1 is displayed on monitor 14. Measurement range MMA on screen ScA is a part of measurement range DD1, and a frame line as a boundary line is displayed. Consequently, a user can discriminate between inside and outside the measurement range. On the other hand, region BB1 outside angle of view MM1 and in measurement range DD1 is outside the angle of view, and thus the captured image is not displayed therein. Although region BB1 is painted black in FIG. 4B, a heat map image may be displayed therein.

In a case where target device Tg1 is located at position B, as illustrated in FIG. 4C, monitor 14 displays a measurement result (screen ScB) of which a display range is a range including angle of view MM1 and measurement range DD1. Measurement range MMB on screen ScA is a part of measurement range DD1, and a frame line as a boundary line is displayed. Consequently, a user can discriminate between inside and outside the measurement range.

As described above, electromagnetic wave visualization device 100 can efficiently display the measurement result of the region required by the user among the measurement results regarding the electromagnetic wave intensity of target device Tg1 and thus improve the user's convenience.

Figure 5:
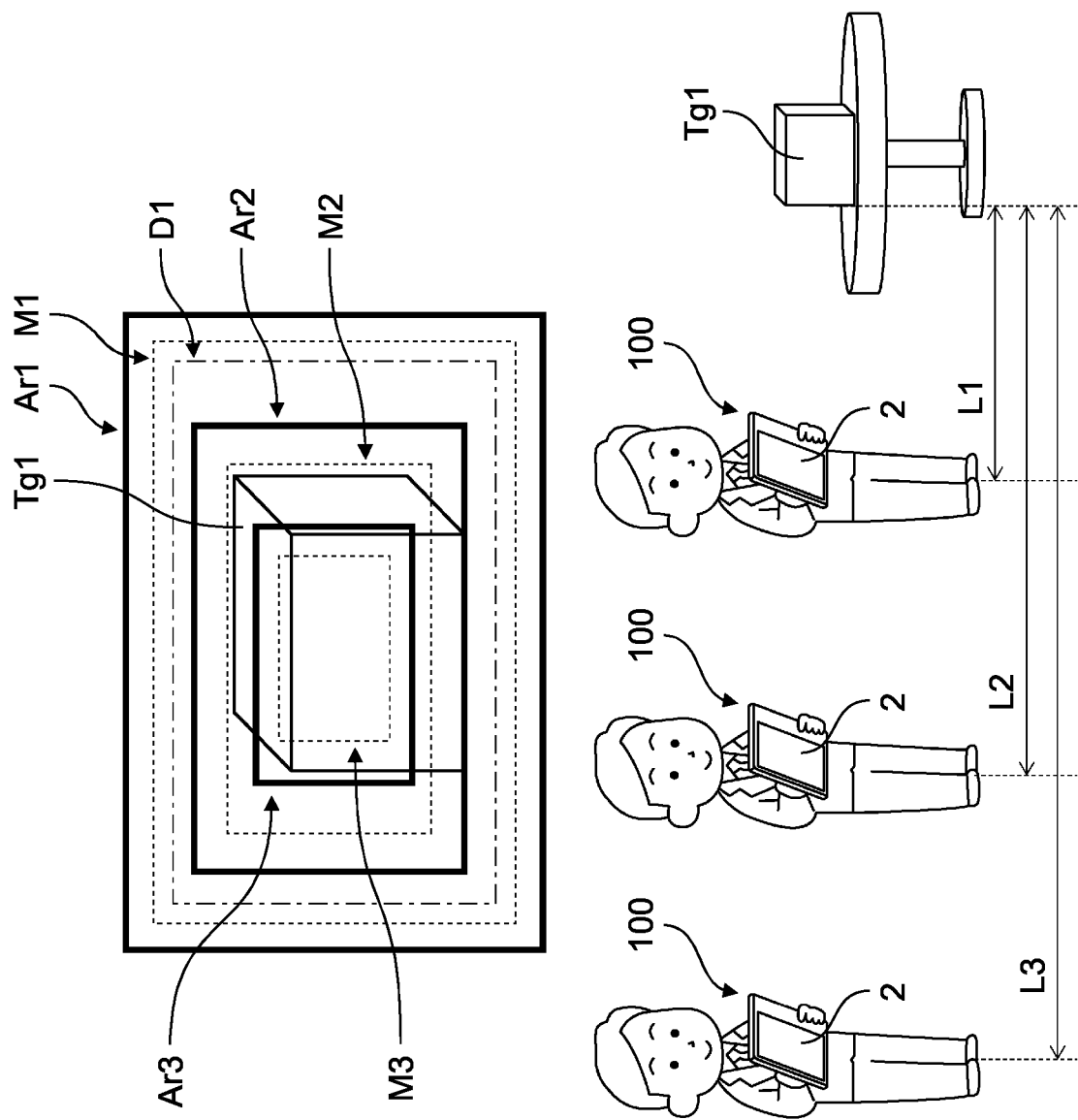
FIG. 5 is a diagram for describing an example of a display range for each measurement distance.

With reference to FIG. 5, an angle of view and a display range of a measurement result displayed on monitor 14 in a case where a measurement distance between target device Tg1 and electromagnetic wave visualization device 100 is changed will be described. FIG. 5 is a diagram for describing an example of a display range for each measurement distance. A user in FIG. 5 grasps electromagnetic wave visualization device 100 to which measurement unit 2 is attached, and measures the electromagnetic wave intensity generated from target device Tg1 in operation at each of plurality of measurement distances L1, L2, and L3. Hereinafter, a change in a display range of a measurement result in a case where the user moves from measurement distance L3 to measurement distance L1 will be described. The user in FIG. 5 is imaging target device Tg1 from the same direction such that an angle between the grasped electromagnetic wave visualization device 100 (that is, measurement unit 2) and target device Tg1 differs only in an imaging distance.

The display range referred to here indicates a range displayed on monitor 14 in a composite image generated by superimposing a heat map image indicating a measurement result of the electromagnetic wave intensity in the measurement range on a captured image from camera 13. Consequently, the user can check the measurement result indicated by the composite image in a larger image because a composite image in the range required by the user is cut out from the composite image and displayed on monitor 14.

Electromagnetic wave visualization device 100 at measurement distance L3 captures an image of target device Tg1 in an imaging region indicated by angle of view Ar1, and sets measurement range M1 including target device Tg1 on the basis of the captured image. In electromagnetic wave visualization device 100, designated range D1 including target device Tg1 is similarly designated by the user. In such a case, electromagnetic wave visualization device 100 sets measurement range M1 that is a range including measurement range M1 and designated range D1 as a display range. In a case where measurement range M1 is smaller than designated range D1, electromagnetic wave visualization device 100 sets the display range to designated range D1.

Electromagnetic wave visualization device 100 at measurement distance L2 captures an image of target device Tg1 in an imaging region indicated by angle of view Ar2. Angle of view Ar2 at measurement distance L2 includes substantially the entire target device Tg1. Measurement range M2 is a range including a part of target device Tg1, and this range corresponds to a position and a size of measurement range M1 at angle of view Ar1. On the other hand, designated range D1 is not changed from the range indicated by angle of view Ar1 at measurement distance L3 regardless of the magnitude of the measurement distance, and is thus located outside angle of view Ar2 at measurement distance L2. In such a case, electromagnetic wave visualization device 100 cannot set designated range D1 desired by the user as a display range, and thus sets measurement range M2 as a display range. Electromagnetic wave visualization device 100 may execute image processing within angle of view Ar2 and set angle of view Ar2 including substantially the entire target device Tg1 as a display range.

Electromagnetic wave visualization device 100 at measurement distance L1 captures an image of target device Tg1 in an imaging region indicated by angle of view Ar3. Angle of view Ar3 and measurement range M3 at measurement distance L1 include a part of target device Tg1. In the same manner as measurement range M2, measurement range M3 is a range corresponding to a position and a size of measurement range M1 at angle of view Ar1. Designated range D1 is located outside angle of view Ar3 at measurement distance L1. In such a case, electromagnetic wave visualization device 100 cannot set designated range D1 desired by the user as the display range, and thus sets measurement range M3 as a display range. Electromagnetic wave visualization device 100 may execute image processing within angle of view Ar3 and set angle of view Ar3 including target device Tg1 as a display range.

Consequently, the user can efficiently check a measurement result of the region required by the user among the measurement results regarding the electromagnetic wave intensity of the target device.

Figure 6:
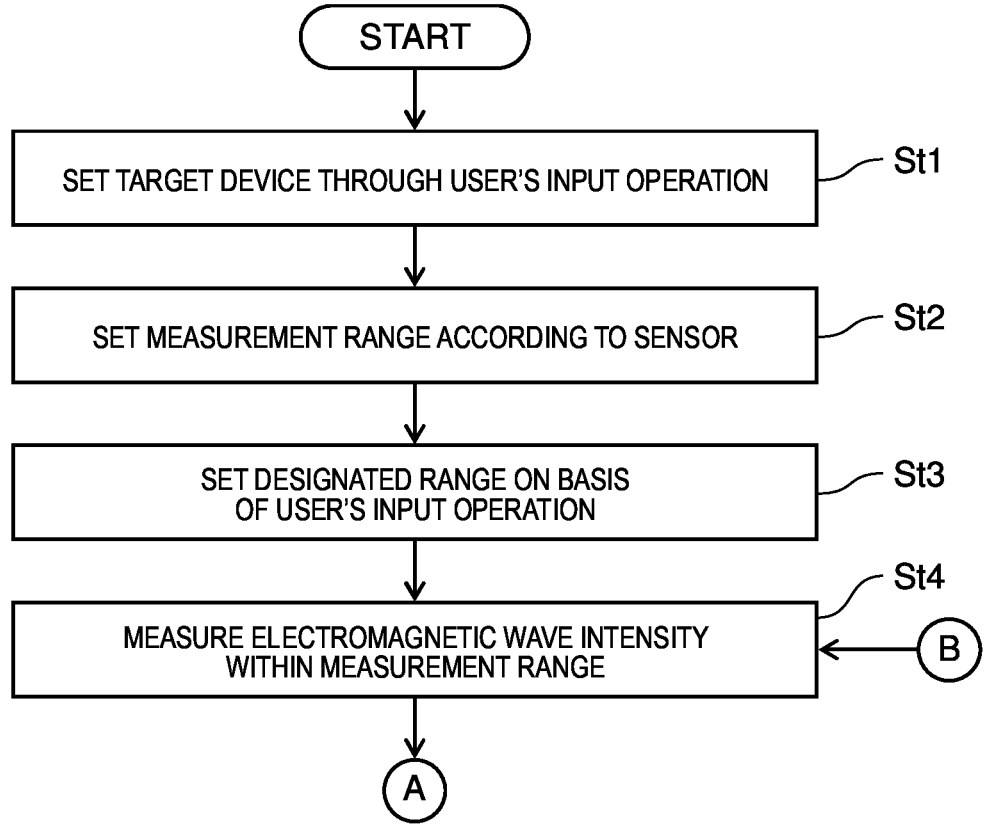
FIG. 6 is a flowchart illustrating an operation procedure example of the electromagnetic wave visualization device according to Exemplary Embodiment 1.
Figure 7:
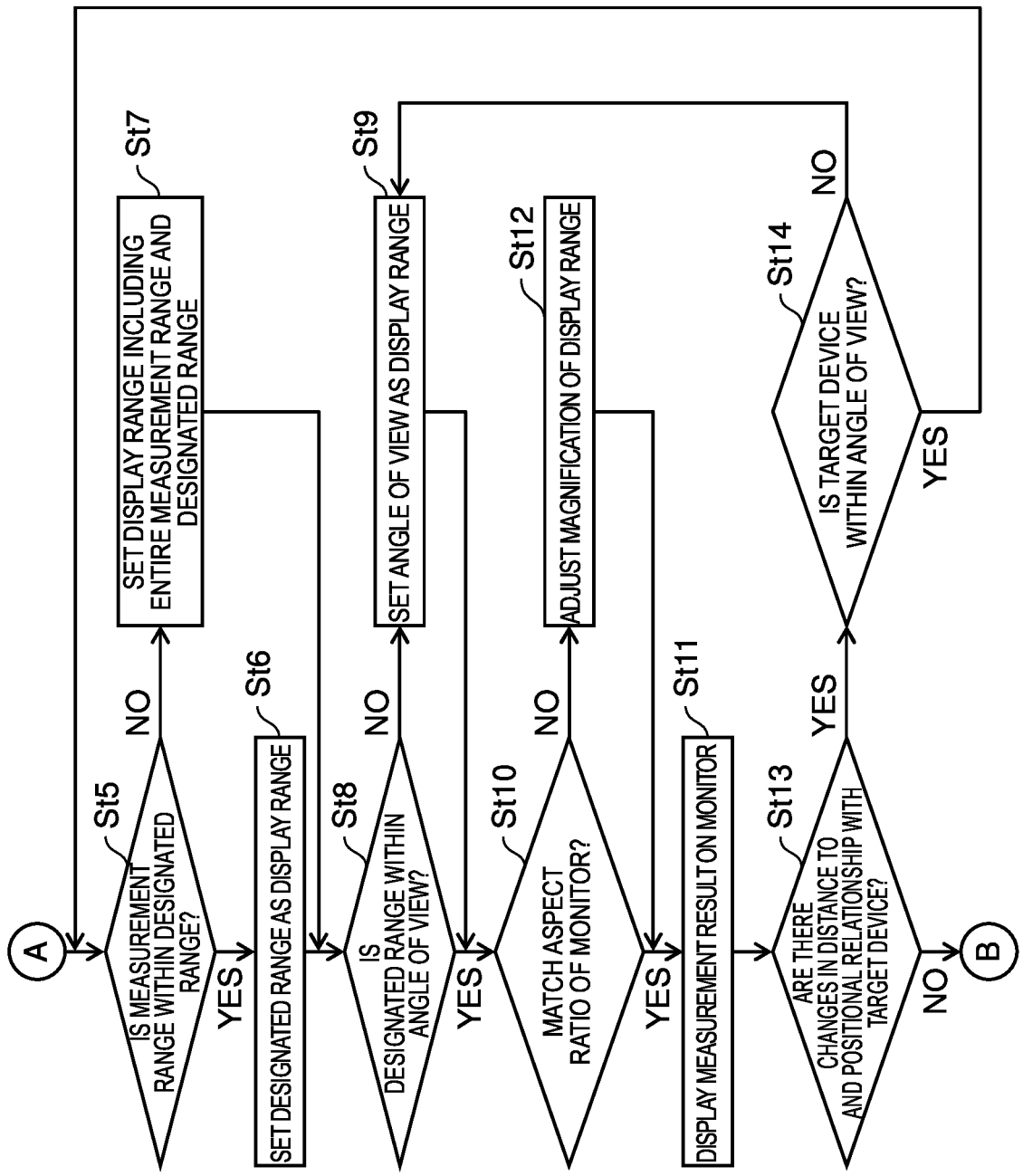
FIG. 7 is a flowchart illustrating an operation procedure example of the electromagnetic wave visualization device according to Exemplary Embodiment 1.

Next, an operation procedure example of electromagnetic wave visualization device 100 will be described with reference to FIGS. 6 and 7. With reference to FIGS. 8A to 12B, an example of each process described in the operation procedure example of electromagnetic wave visualization device 100 and a display example of monitor 14 will be described. FIGS. 6 and 7 are flowcharts illustrating an operation procedure example of electromagnetic wave visualization device 100 according to Exemplary Embodiment 1. In the operation procedure example illustrated in FIGS. 6 and 7, an example in which electromagnetic wave visualization device 100 includes constituents such as camera 13 and monitor 14 will be described, but needless to say, a configuration of electromagnetic wave visualization device 100 is not limited to this.

Terminal device 1 displays a captured image acquired by camera 13 on monitor 14. Terminal device 1 sets one target device Tg1 among one or more target devices captured in the captured image as a target of which an electromagnetic wave is to be measured on the basis of a user's input operation (St1). The process in step St1 is not essential, and in a case where there is no user's input operation, target device Tg1 may be set on the basis of image processing by camera 13.

Terminal device 1 executes image processing on the captured image and acquires a contour of target device Tg1 of which the electromagnetic wave intensity is measured. Terminal device 1 sets a range in which sensor 30 can measure the electromagnetic wave intensity as a measurement range (St2).

Terminal device 1 displays the captured image acquired by camera 13 on monitor 14, and sets a designated range on the basis of the user's input operation for the captured image (St3). The designated range may be larger or smaller than the measurement range.

Terminal device 1 measures an electromagnetic wave intensity within the measurement range set in the process in step St2 (St4).

Here, terminal device 1 proceeds to an operation procedure for setting the display range. Terminal device 1 determines whether or not the set measurement range is within the designated range (St5).

In a case where the set measurement range is within the designated range in the process in step St5, (St5, YES), terminal device 1 sets the designated range as a display range (St6).

Here, in a case where the set measurement range is within the designated range in the process in step St5 (St5, YES), a relationship between an angle of view, a designated range, and a measurement range, and a display example thereof will be described with reference to FIGS. 8A and 8B.

Figure 8A:
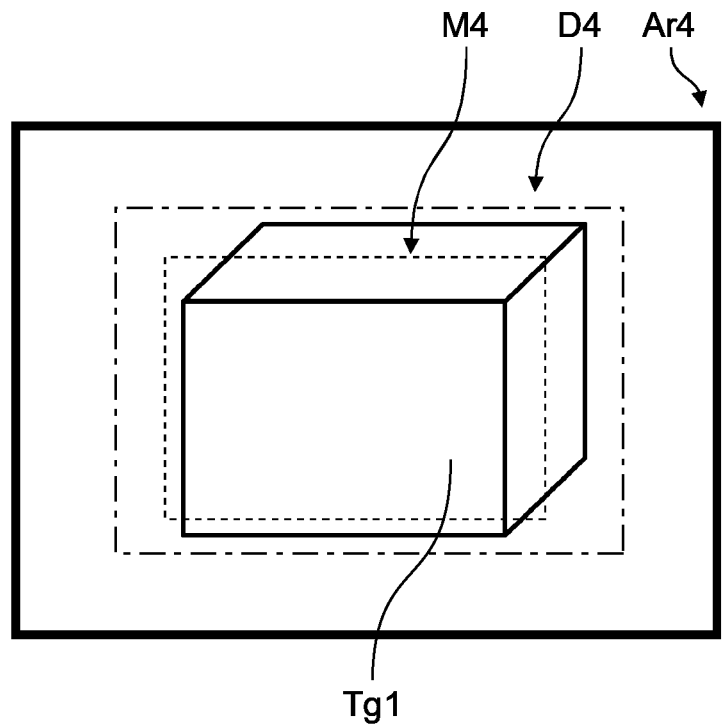
FIG. 8A is a diagram illustrating an example of a case where a measurement range is included in a designated range.
Figure 8B:
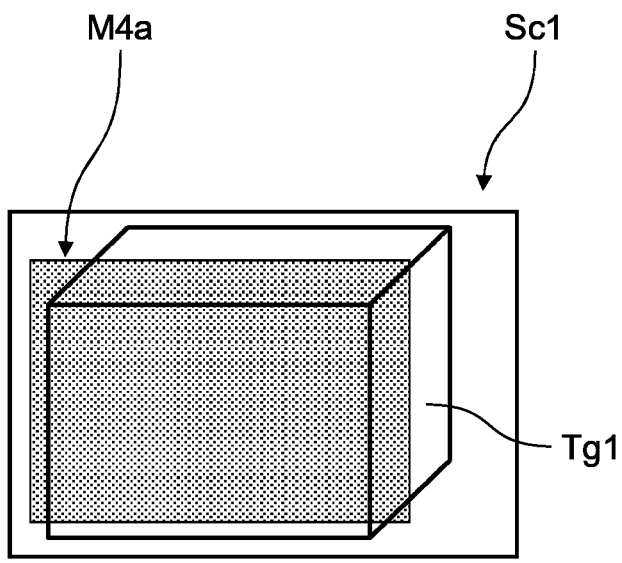
FIG. 8B is a diagram illustrating a display example of a measurement result in the case where the measurement range is included in the designated range.

FIG. 8A is a diagram illustrating an example of a case where measurement range M4 is included in designated range D4. FIG. 8B is a diagram illustrating a display example of a measurement result in the case where measurement range M4 is included in designated range D4. Angle of view Ar4 illustrated in FIG. 8A includes the entire target device Tg1, designated range D4, and measurement range M4. Designated range D4 includes the entire target device Tg1 and the entire measurement range M4. Measurement range M4 includes a part of target device Tg1.

In such a case, terminal device 1 sets designated range D4 including the entire measurement range M4 as a display range and thus sets the display range including the entire measurement range and the designated range. As a result, terminal device 1 generates a measurement result (screen Sc1) obtained by cutting out a composite image in the set display range from the composite image and displays the measurement result on monitor 14. In measurement range M4a on screen Sc1, a frame line as a boundary line is displayed such that the inside and the outside of the measurement range can be discriminated.

On the other hand, in a case where the set measurement range is not within the designated range in the process in step St5 (St5, NO), terminal device 1 sets a display range including the entire measurement range and the designated range (St7).

Here, in a case where the set measurement range is not within the designated range in the process in step St5 (St5, NO), a relationship between an angle of view, a designated range, and a measurement range, and a display example thereof will be described with reference to FIGS. 9A, 9B, 10A, and 10B.

Figure 9A:
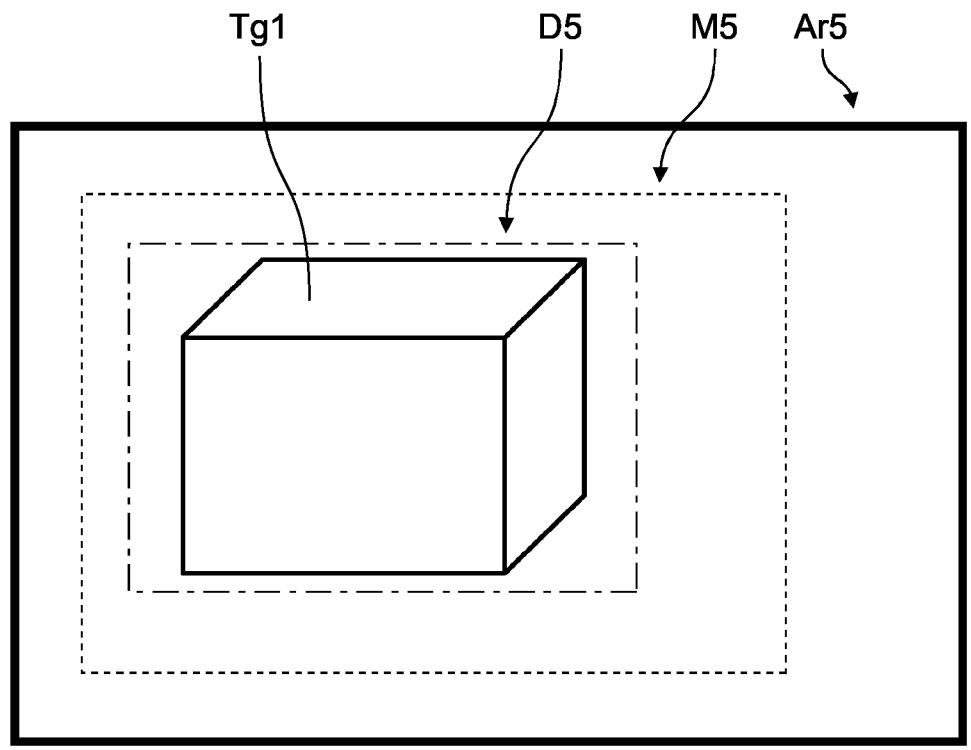
FIG. 9A is a diagram illustrating an example of a case where a designated range is included in a measurement range.
Figure 9B:
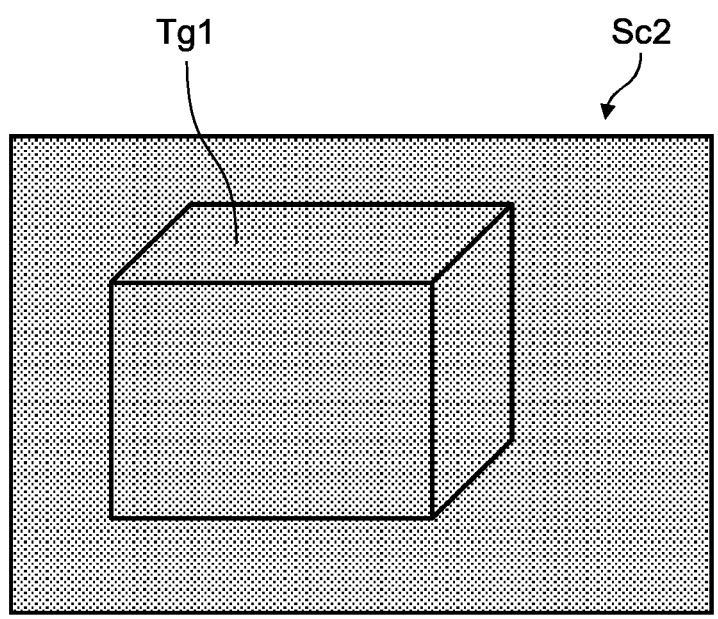
FIG. 9B is a diagram illustrating a display example of a measurement result in the case where the designated range is included in the measurement range.

FIG. 9A is a diagram illustrating an example of a case where designated range D5 is included in measurement range M5. FIG. 9B is a diagram illustrating a display example of a measurement result in the case where designated range D5 is included in measurement range M5. Angle of view Ar5 illustrated in FIG. 9A includes the entire target device Tg1, designated range D5, and measurement range M5. The entire target device Tg1 is included in designated range D5. Designated range D5 is smaller than measurement range M5, and the entire range thereof is included in measurement range M5.

In such a case, terminal device 1 sets measurement range M5 including the entire designated range D5 as a display range and thus sets the display range including the entire measurement range and the designated range. As a result, terminal device 1 generates a measurement result (screen Sc2) obtained by cutting out a composite image in the set display range from the composite image and displays the measurement result on monitor 14.

Figure 10A:
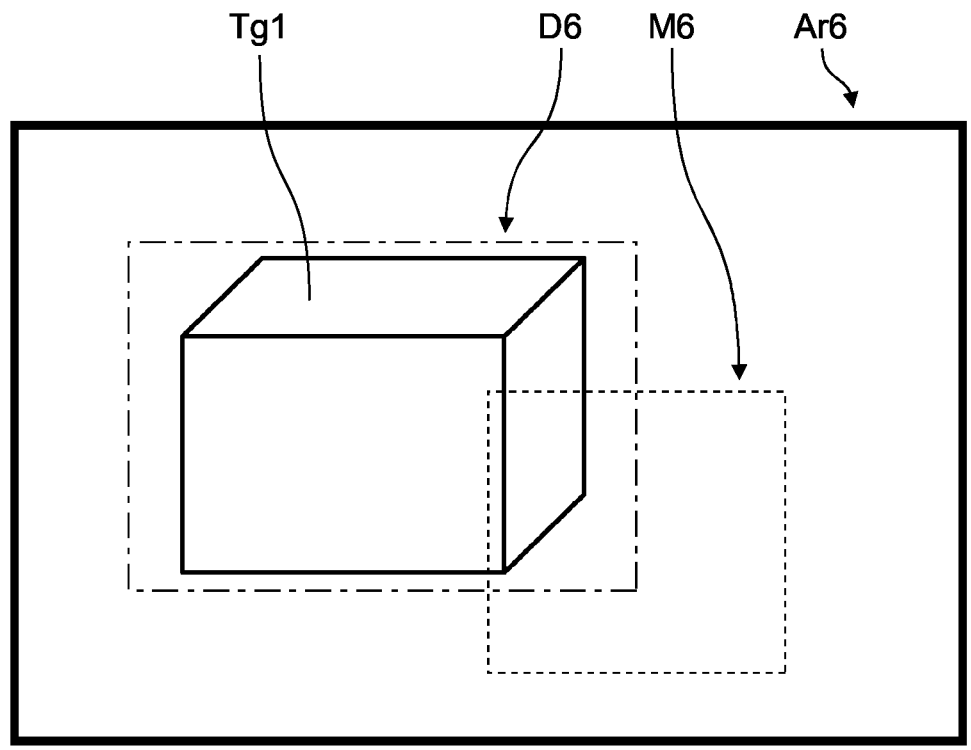
FIG. 10A is a diagram illustrating an example of a case where a part of a designated range is included in a measurement range.
Figure 10B:
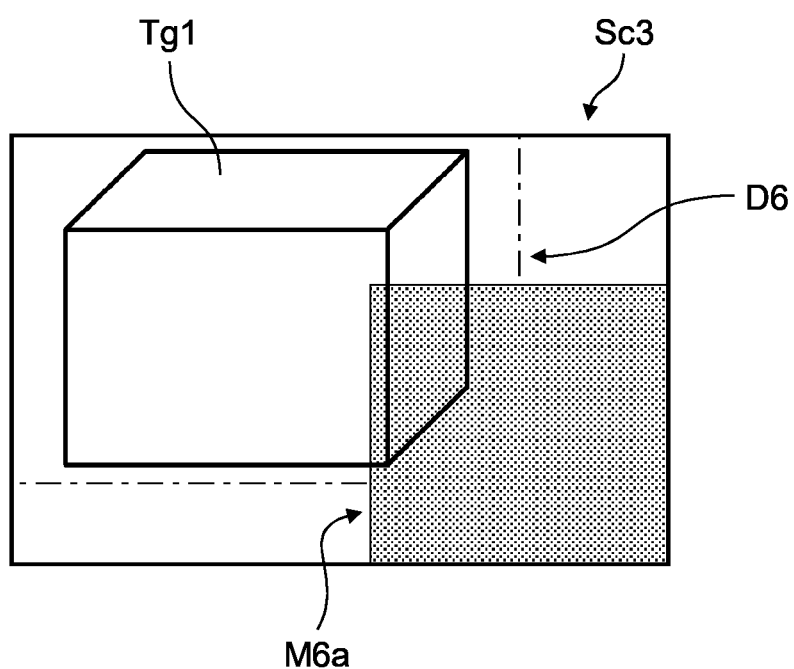
FIG. 10B is a diagram illustrating a display example of a measurement result in the case where a part of the designated range is included in the measurement range.

Other examples will be described with reference to FIGS. 10A and 10B. FIG. 10A is a diagram illustrating an example of a case where a part of designated range D6 is included in measurement range M6. FIG. 10B is a diagram illustrating a display example of a measurement result in the case where a part of designated range D6 is included in measurement range M6. Angle of view Ar6 illustrated in FIG. 10A includes the entire target device Tg1, designated range D6, and measurement range M6. The entire target device Tg1 is included in designated range D6. Measurement range M6 includes a part of designated range D6 and a part of target device Tg1.

In such a case, terminal device 1 sets a display range including measurement range M6 and designated range D6. As a result, terminal device 1 generates a measurement result (screen Sc3) obtained by cutting out a composite image in the set display range from the composite image and displays the measurement result on monitor 14. In measurement range M6a on screen Sc3, a frame line as a boundary line is displayed such that the inside and the outside of the measurement range can be discriminated. In FIG. 10B, a one-dot chain line indicating designated range D6 is displayed in order to make each range included in screen Sc3 easy to understand, but this is not essential and needs not be displayed.

After the processes in steps St6 and St7, terminal device 1 further determines whether or not the designated range is within the current angle of view (St8). The process in step St8 is an effective process, for example, in a case where the user reduces a measurement distance between terminal device 1 and target device Tg1 (in other words, brings terminal device 1 close to target device Tg1).

In a case where the designated range is within the current angle of view in the process in step St8 (St8, YES), terminal device 1 maintains the currently set display range and further proceeds to the process in step St10.

On the other hand, in a case where the designated range is not within the current angle of view in the process in step St8 (St8, NO), terminal device 1 sets the angle of view as a display range (St9) and proceeds to the process in step St10.

Terminal device 1 determines whether or not the currently set display range matches an aspect ratio of monitor 14 (St10).

In a case where the currently set display range matches the aspect ratio of monitor 14 in the process in step St10 (St10, YES), terminal device 1 generates a measurement result by cutting out a composite image in the set display range from the generated composite image, and displays the measurement result on monitor 14 (St11).

On the other hand, in a case where the display range currently set does not match the aspect ratio of monitor 14 in the process in step St10 (St10, NO), terminal device 1 adjusts a magnification of the set display range in the generated composite image. Specifically, terminal device 1 adjusts the magnification such that a length of a long side in the composite image of the display range matches a short side of a displayable region of monitor 14 (St12). After the adjustment, terminal device 1 cuts out a composite image in the display range, generates a measurement result, and displays the measurement result on monitor 14 (St11).

Here, in a case where the set measurement range is not within the designated range in the process in step St10 (St10, NO), a relationship between an angle of view, a designated range and a measurement range, and a display example thereof will be described with reference to FIGS. 11A and 11B.

Figure 11A:
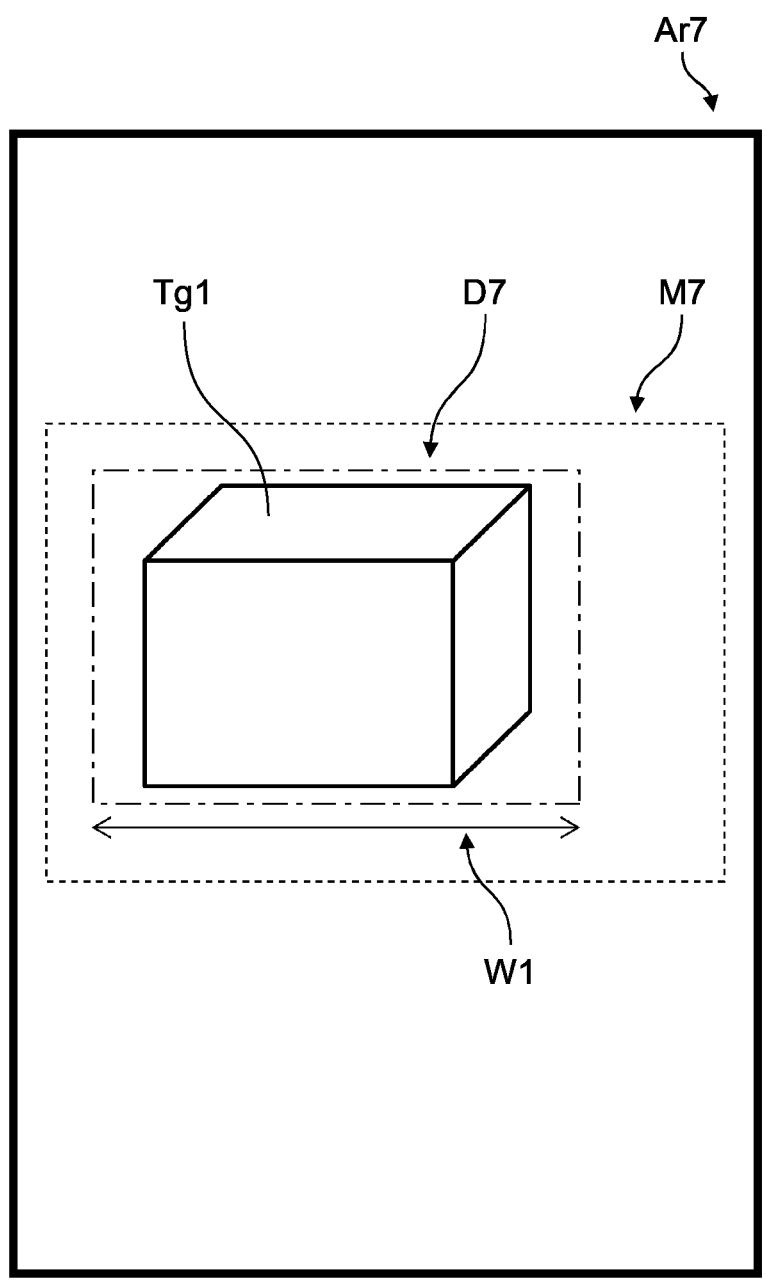
FIG. 11A is a diagram illustrating an example of a case where a display range is required to be adjusted.
Figure 11B:
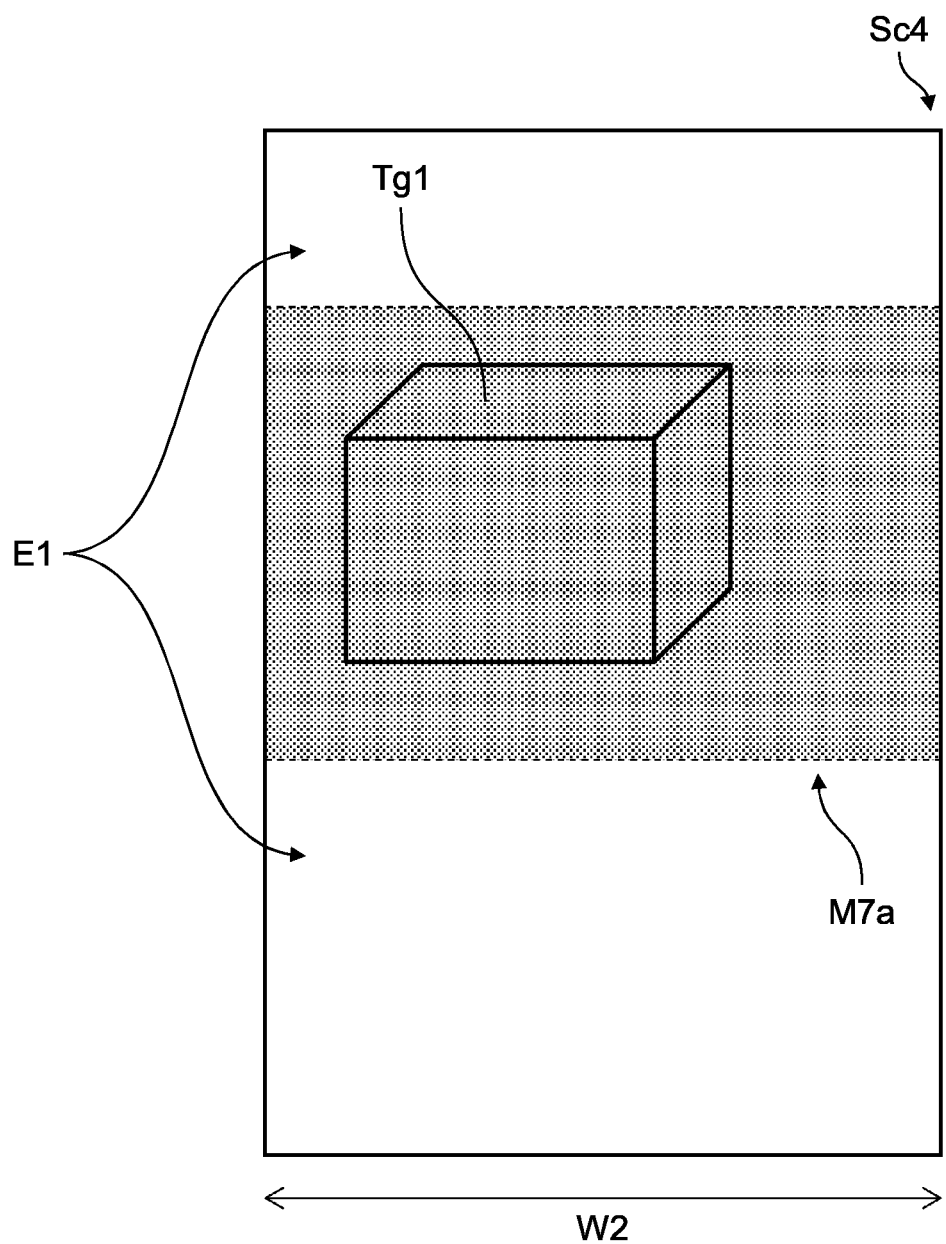
FIG. 11B is a diagram illustrating a display example of a measurement result in a case where the display range has been adjusted.

FIG. 11A is a diagram illustrating an example of a case where a display range is required to be adjusted. FIG. 11B is a diagram illustrating a display example of a measurement result in the case where the display range has been adjusted. Angle of view Ar7 illustrated in FIG. 11A includes the entire target device Tg1, designated range D7, and measurement range M7. The entire target device Tg1 is included in designated range D7. Designated range D7 is smaller than measurement range M7, and the entire range thereof is included in measurement range M7.

In such a case, in terminal device 1, measurement range M7 including the entire designated range D7 is set as the current display range. As a result, terminal device 1 generates a measurement result obtained by cutting out a composite image in the set display range from the composite image. Here, monitor 14 of terminal device 1 includes a display region capable of displaying angle of view Ar7. Therefore, terminal device 1 increases or reduces length W1 of the long side of the display range to match length W2 of the short side of monitor 14 in the measurement result obtained by cutting out the composite image in the set display range.

In measurement range M7a on screen Sc4, a frame line as a boundary line is displayed such that the inside and the outside of the measurement range can be discriminated. As illustrated in FIG. 11B, the original composite image before being cut out may be displayed in blank region E1 outside measurement range M7a.

After the process in step St11, terminal device 1 determines whether or not there are changes in the distance and the positional relationship between terminal device 1 and target device Tg1 (St13).

In a case where there are changes in the distance and the positional relationship between terminal device 1 and target device Tg1 (St13, YES), terminal device 1 further determines whether or not target device Tg1 is within the current angle of view (St14).

On the other hand, in a case where there are no changes in the distance and the positional relationship between terminal device 1 and target device Tg1 (St13, NO), terminal device 1 proceeds to the process in step St4, and after the measurement, the processes in and after step St5 for setting a display range to be displayed on monitor 14 are executed on a measurement result of an electromagnetic wave intensity measured again.

In a case where target device Tg1 is within the angle of view in the process in step St14 (St14, YES), terminal device 1 executes the processes in and after step St5 for setting a display range to be displayed on monitor 14 on a measurement result of the electromagnetic wave intensity.

On the other hand, in a case where target device Tg1 is not within the angle of view in the process in step St14 (St14, NO), terminal device 1 proceeds to the process in step St9.

Here, in a case where target device Tg1 is not within the angle of view in the process in step St14 (St14, NO), a relationship between an angle of view, a designated range, and a measurement range, and a display example thereof will be described with reference to FIGS. 12A and 12B.

Figure 12A:
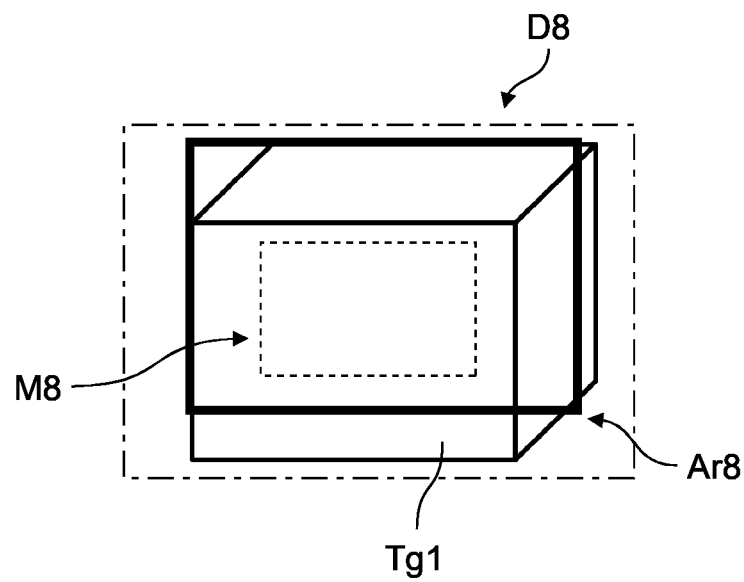
FIG. 12A is a diagram illustrating an example of a case where a designated range is not included in an angle of view.
Figure 12B:
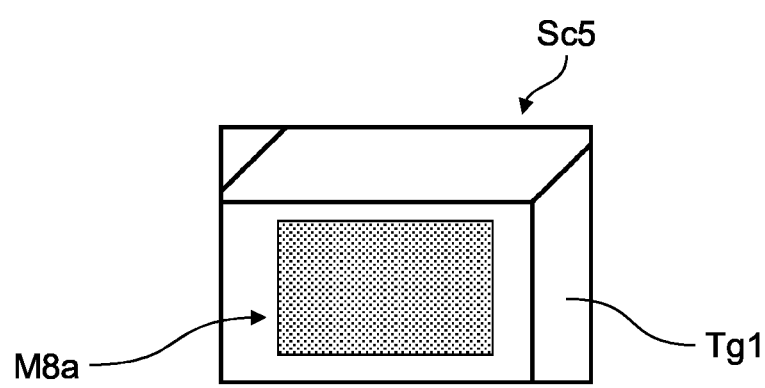
FIG. 12B is a diagram illustrating a display example of a measurement result in the case where the designated range is not included in the angle of view.

FIG. 12A is a diagram illustrating an example of a case where designated range D8 is not included in angle of view Ar8. FIG. 12B is a diagram illustrating a display example of a measurement result in the case where designated range D8 is not included in angle of view Ar8. Angle of view Ar8 illustrated in FIG. 12A includes a part of target device Tg1 and measurement range M8. Designated range D8 includes angle of view Ar8, the entire target device Tg1, and the entire measurement range M8. Measurement range M8 is included in angle of view Ar8 and includes a part of target device Tg1.

In such a case, terminal device 1 sets angle of view Ar8 as a display range. As a result, terminal device 1 generates a measurement result (screen Sc5) consisting of the entire composite image. In measurement range M8a on screen Sc5, a frame line as a boundary line is displayed such that the inside and the outside of the measurement range can be discriminated.

As described above, electromagnetic wave visualization device 100 according to Exemplary Embodiment 1 can efficiently display the measurement result of the region required by the user among the measurement results regarding the electromagnetic wave intensity of the target device and thus improve the user's convenience.

Hereinafter, a modification example of electromagnetic wave visualization device 100 according to Exemplary Embodiment 1 will be described.

Electromagnetic wave visualization device 100 according to Exemplary Embodiment 1 may further include a laser device (not illustrated) in terminal device 1 or measurement unit 2. The laser device is controlled by processor 11. The laser device irradiates and indicates, with a visible light laser, one of a designated range, a measurement range, and a display range set for target device Tg1 selected by a user from among one or more target devices captured in an imaging region.

Consequently, electromagnetic wave visualization device 100 can irradiate (project) any one of the designated range, the measurement range, and the display range displayed on monitor 14 into an actual space. Therefore, the user can visually check any one of the designated range, the measurement range, and the display range displayed on a display screen of monitor 14 of electromagnetic wave visualization device 100 at hand. In a case where the electromagnetic wave intensity is measured by each of a plurality of users, it is easy for each of the plurality of users to share settings of the designated range, the measurement range, and the display range.

Electromagnetic wave visualization device 100 according to Exemplary Embodiment 1 may include a projector (not illustrated) in terminal device 1 or measurement unit 2. The projector is controlled by processor 11. The projector projects a heat map image as a measurement result of the electromagnetic wave intensity onto target device Tg1 to enable so-called projection mapping. Consequently, electromagnetic wave visualization device 100 can irradiate (project) the measurement result (heat map image) of the electromagnetic wave intensity generated from target device Tg1 in operation onto the actual space. Therefore, the user can visually check the measurement result (heat map image) of the electromagnetic wave intensity of target device Tg1. In a case where the electromagnetic wave intensity is measured by each of a plurality of users, each of the plurality of users can easily share the measurement result (heat map image) of the electromagnetic wave intensity of target device Tg1.

As described above, electromagnetic wave visualization device 100 according to Exemplary Embodiment 1 includes an image acquisition unit (camera 13) that captures an image of a target device; measurement unit 2 that measures an electromagnetic wave intensity of target device Tg1; a controller (processor 11) that generates a composite image in which a measurement result of the electromagnetic wave intensity measured by measurement unit 2 is superimposed on the captured image of target device Tg1 acquired by the image acquisition unit; and an output unit (monitor 14) that displays the composite image generated by the controller. The controller of electromagnetic wave visualization device 100 generates the composite image including a measurement range of measurement unit 2 and outputs the composite image to the output unit.

Consequently, electromagnetic wave visualization device 100 can efficiently display a measurement result of a region required by a user among measurement results regarding the electromagnetic wave intensity of target device Tg1 and thus improve the user's convenience.

The controller of electromagnetic wave visualization device 100 according to Exemplary Embodiment 1 sets a designated range to be output to the output unit on the basis of a user's input operation, and generates the composite image including the designated range and a part or the whole of the measurement range. Consequently, electromagnetic wave visualization device 100 can generate a measurement result (composite image) of a region required by the user among the measurement results regarding the electromagnetic wave intensity of target device Tg1.

The controller of electromagnetic wave visualization device 100 according to Exemplary Embodiment 1 generates a composite image including the designated range and the entire measurement range in a case where a part of the measurement range there is not included in the designated range. Consequently, electromagnetic wave visualization device 100 can generate a measurement result (composite image) including a region (designated range) that the user wants to see and a region (measurement range) that requires the measurement result among measurement results regarding the electromagnetic wave intensity of target device Tg1.

The controller of electromagnetic wave visualization device 100 according to Exemplary Embodiment 1 calculates an offset amount based on a difference between coordinate positions of a position of a central axis of the image acquisition unit and a central position of measurement unit 2, and generates the composite image in which the measurement result of the electromagnetic wave intensity for each coordinate of measurement unit 2 is superimposed on the captured image on the basis of the offset amount. Consequently, electromagnetic wave visualization device 100 can generate a measurement result (composite image) in which a deviation is corrected even if there is the deviation between a reference point of an angle of view of the image acquisition unit and a reference point of a reception range of measurement unit 2.

The controller of electromagnetic wave visualization device 100 according to Exemplary Embodiment 1 maintains an aspect ratio of the composite image, and generates an enlarged or reduced composite image such that the composite image is displayed in the largest size on the output unit. Consequently, electromagnetic wave visualization device 100 can generate a larger and easier-to-see measurement result (composite image) and output the composite image to the output unit.

Electromagnetic wave visualization device 100 according to Exemplary Embodiment 1 further includes a distance measuring unit (camera 13) that measures a distance and a direction from electromagnetic wave visualization device 100 to target device Tg1, and the controller changes a display range on the basis of a distance measurement result from the distance measuring unit. Consequently, electromagnetic wave visualization device 100 can efficiently display a measurement result of a region required by the user among measurement results regarding the electromagnetic wave intensity of target device Tg1.

In a case where the designated range is larger than the current angle of view, the controller of electromagnetic wave visualization device 100 according to Exemplary Embodiment 1 generates a composite image corresponding to the current angle of view. Consequently, electromagnetic wave visualization device 100 can efficiently display a measurement result of a region required by the user among measurement results regarding the electromagnetic wave intensity of target device Tg1.

Although various exemplary embodiments have been described above with reference to the accompanying drawings, the present disclosure is not limited to such examples. It is obvious that a person skilled in the art can conceive of various changes, modifications, replacements, additions, deletions, and equivalents within the category disclosed in the claims, and it is understood that they fall within the technical scope of the present disclosure. The respective constituents in the various exemplary embodiments described above may be freely combined within the scope without departing from the concept of the invention.

INDUSTRIAL APPLICABILITY

The present disclosure is useful as an electromagnetic wave visualization device that efficiently displays a measurement result of a region required by a user among measurement results regarding an electromagnetic wave intensity of a target device and thus improves the user's convenience.

REFERENCE MARKS IN THE DRAWINGS

1 Terminal device
2 Measurement unit
10 Communicator
11 Processor
12 Memory
13 Camera
14 Monitor
20 Signal processor
30 Sensor
40 ID storage unit
100 Electromagnetic wave visualization device
Tg1 Target device
D1, D4, D5, D6, D7, D8 Designated range
DD1, MMA, MMB, M1, M2, M3, M4, M4a, M5, M6, M6a, M7, M7a, M8, M8a Measurement range
Ar1, Ar2, Ar3, Ar4, Ar5, Ar6, Ar7, Ar8, MM1 Angle of view

The invention claimed is:

1. An electromagnetic wave visualization device comprising:
- an image acquisition unit that has an angle of view and captures an image of a target device;
- a measurement unit that measures an electromagnetic wave intensity of the target device;
- a controller that sets a measurement range of the measurement unit, the measurement range defined as a range in which the measurement unit can measure the electromagnetic wave intensity, wherein the controller further sets a composite image in which a measurement result of the measured electromagnetic wave intensity is superimposed on the captured image of the target device acquired by the image acquisition unit; and
- an output unit that outputs the composite image generated by the controller,
- wherein the controller generates the composite image including a region outside the angle of view and within the measurement range of the measurement unit, and outputs the composite image to the output unit.

2. The electromagnetic wave visualization device according to claim 1, wherein the controller sets a designated range to be output to the output unit on the basis of a user's input operation, and generates the composite image including the designated range and a part or a whole of the measurement range.

3. The electromagnetic wave visualization device according to claim 2, wherein, in a case where a part of the measurement range is not included in the designated range, the controller generates the composite image including the designated range and the whole of the measurement range.

4. The electromagnetic wave visualization device according to claim 1, wherein the controller calculates an offset amount based on a difference between coordinate positions of a position of a central axis of the image acquisition unit and a central position of the measurement unit, and generates the composite image in which the measurement result of the electromagnetic wave intensity for each coordinate of the measurement unit is superimposed on the captured image on the basis of the offset amount.

5. The electromagnetic wave visualization device according to claim 1, wherein the controller maintains an aspect ratio of the composite image and generates the composite image that is enlarged or reduced such that the composite image is output in a largest size in the output unit.

6. The electromagnetic wave visualization device according to claim 2, further comprising a distance measuring unit that measures a distance and a direction from the electromagnetic wave visualization device to the target device,
- wherein the controller changes the composite image to be output to the output unit on the basis of a distance measurement result from the distance measuring unit.

7. The electromagnetic wave visualization device according to claim 6, wherein, in a case where the designated range is larger than a current angle of view of the image acquisition unit, the controller generates the composite image corresponding to the current angle of view.

* * * * *